(12) United States Patent
Takahashi

(10) Patent No.: US 7,763,516 B2
(45) Date of Patent: Jul. 27, 2010

(54) MANUFACTURING METHOD OF SEMICONDUCTOR DEVICE HAVING TRENCH ISOLATION

(75) Inventor: Toshifumi Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 3 days.

(21) Appl. No.: 12/285,391

(22) Filed: Oct. 3, 2008

(65) Prior Publication Data

US 2009/0093098 A1 Apr. 9, 2009

(30) Foreign Application Priority Data

Oct. 4, 2007 (JP) ............................. 2007-260536

(51) Int. Cl.
*H01L 21/8234* (2006.01)
(52) U.S. Cl. ..................... 438/276; 438/429; 438/750; 257/E21.616
(58) Field of Classification Search ................. 438/276, 438/429, 750; 257/E21.616
See application file for complete search history.

(56) References Cited

U.S. PATENT DOCUMENTS

| 6,372,602 B1 | 4/2002 | Mitsuiki |
| 6,909,976 B2 | 6/2005 | Kitamaru et al. |
| 6,995,095 B2 * | 2/2006 | Yu .............................. 438/750 |
| 7,096,129 B2 | 8/2006 | Kitamaru et al. |
| 7,402,499 B2 * | 7/2008 | Kitamura et al. ............. 438/429 |
| 2002/0182786 A1 * | 12/2002 | Chien et al. .................. 438/149 |

FOREIGN PATENT DOCUMENTS

| JP | 2000-323563 A | 11/2000 |
| JP | 2003-077934 A | 3/2003 |

\* cited by examiner

*Primary Examiner*—Charles D Garber
*Assistant Examiner*—Stanetta D Isaac
(74) *Attorney, Agent, or Firm*—Foley & Lardner LLP

(57) ABSTRACT

A manufacturing method of semiconductor device includes: forming a nitride film above a silicon substrate including a first region and a second region which respectively correspond to an outside of a memory cell region and the memory cell region; forming trenches reaching from the nitride film to the silicon substrate; retreating the nitride film such that widths of the trenches at the nitride film become wider; forming a buried oxide film to be buried in the trenches after the retreating; polishing the buried oxide film with the nitride film being used as a stopper; removing the nitride film after the polishing; implanting impurity after the removing; forming gate electrodes after the implanting; and implanting impurity after the forming the gate electrodes.

4 Claims, 4 Drawing Sheets

MANUFACTURING METHOD OF SEMICONDUCTOR DEVICE HAVING TRENCH ISOLATION

INCORPORATION BY REFERENCE

This application is based upon and claims the benefit of priority from Japanese patent application No. 2007-260536, filed on Oct. 4, 2007, the disclosure of which is incorporated herein in its entirely by reference.

BACKGROUND OF THE INVENTION

1. Field of the Invention

The present invention relates to a semiconductor device, particularly to a semiconductor device in which shallow trench isolation (STI) is formed for element isolation.

2. Description of Related Art

In order to highly integrate a semiconductor device, STI is employed which can provide a narrow element isolation region. However, a problem is pointed out that a divot (a groove-like step or a dimple) is generated in a dielectric film buried in a trench.

Japanese Laid Open Patent Application (JP-P2000-323563A) discloses a manufacturing method of semiconductor device for preventing the generation of divot. In this manufacturing method, an oxide film is formed on a silicon substrate, an antioxidation film such as a silicon nitride film is formed on the oxide film, a trench for element isolation is formed in the silicon substrate through the antioxidation film and the oxide film, and a dielectric film is formed to be buried in the trench after retreating the antioxidation film by isotropic etching. The antioxidation film is used as a stopper for chemical-mechanical polishing (CMP) of the dielectric film. After the CMP, the antioxidation film is removed and wet etching is applied to the oxide film. In this manufacturing method, since the dielectric film is formed after the retreat of the antioxidation film, the dielectric film is formed on also a portion of the oxide film exposed by the retreat. As a result, the portion of the oxide film under the dielectric film is prevented from being removed in the wet etching and generation of divot is prevented in the dielectric film buried in the trench.

Japanese Laid Open Patent Application (JP-P2003-77934A) discloses an oblique impurity implantation. In the oblique implantation, impurity of the same type as a substrate impurity is implanted in the oblique direction into a substrate with a gate being used as a mask. The oblique implantation can effectively prevent a short channel effect.

The present inventor has recognized as follows.

When the above mentioned process of forming the dielectric film after the retreat of the antioxidation film is applied to manufacture of a semiconductor device including a memory cell region in which memory cells are formed and an outside of the memory cell region, there is a possibility that the following problems are caused. In general, a distance between trenches for element isolation is wider in the outside of the memory cell region than in the memory cell region. Therefore, width of a portion of an antioxidation film above a portion of a silicon substrate between the trenches is narrow in the memory cell region and wide in the outside of the memory cell region. Here, the distance between the trenches corresponds to channel width of a transistor. When the antioxidation film is retreated, a ratio (W1/W2) of width (W1) of the portion of the antioxidation film in the memory cell region relative to width (W2) of the portion of the antioxidation film in the outside of the memory cell region is decreased. Therefore, when impurity for adjusting a threshold voltage of the transistor is implanted into the silicon substrate from a opening formed by removing the antioxidation film, an implantation condition for achieving a proper amount of implanted impurity in the outside of the memory cell region may cause an insufficient amount of implanted impurity in the memory cell region. That is, although the generation of divot can be prevented by forming the dielectric film after the retreat of the antioxidation film, it is difficult to adjust the threshold voltage of the transistor to be a desired value in both the memory cell region and the outside of the memory cell region.

SUMMARY

In one embodiment, a manufacturing method of semiconductor device includes: forming a nitride film above a silicon substrate including a first region and a second region which respectively correspond to an outside of a memory cell region and the memory cell region; forming trenches reaching from the nitride film to the silicon substrate; retreating the nitride film such that widths of the trenches at the nitride film become wider; forming a buried oxide film to be buried in the trenches after the retreating; polishing the buried oxide film with the nitride film being used as a stopper; removing the nitride film after the polishing; implanting impurity after the removing; forming gate electrodes after the implanting; and implanting impurity after the forming the gate electrodes. The trenches include two of first trenches and two of second trenches. The two first trenches are adjacent to each other and formed in the first region. The two second trenches are adjacent to each other and formed in the second region. A portion of the nitride film above a first portion of the silicon substrate between the two first trenches is left in the retreating. A portion of the nitride film above a second portion of the silicon substrate between the two second trenches is removed in there treating. Impurity for adjusting a threshold voltage of a first transistor to be formed in the outside of the memory cell region is implanted into the first portion in the implanting impurity after the removing. A first gate electrode is formed above the first portion and a second gate electrode is formed above the second portion in the forming the gate electrodes.

According to the present invention, generation of a divot in the buried oxide film is prevented and both of the threshold voltage of the first transistor formed in the outside of the memory cell region and the threshold voltage of the second transistor formed in the memory cell region can be adjusted to be desired values.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Referring to the attached drawings, a manufacturing method of semiconductor device according to embodiments of the present invention will be described bellow.

Figure 1:
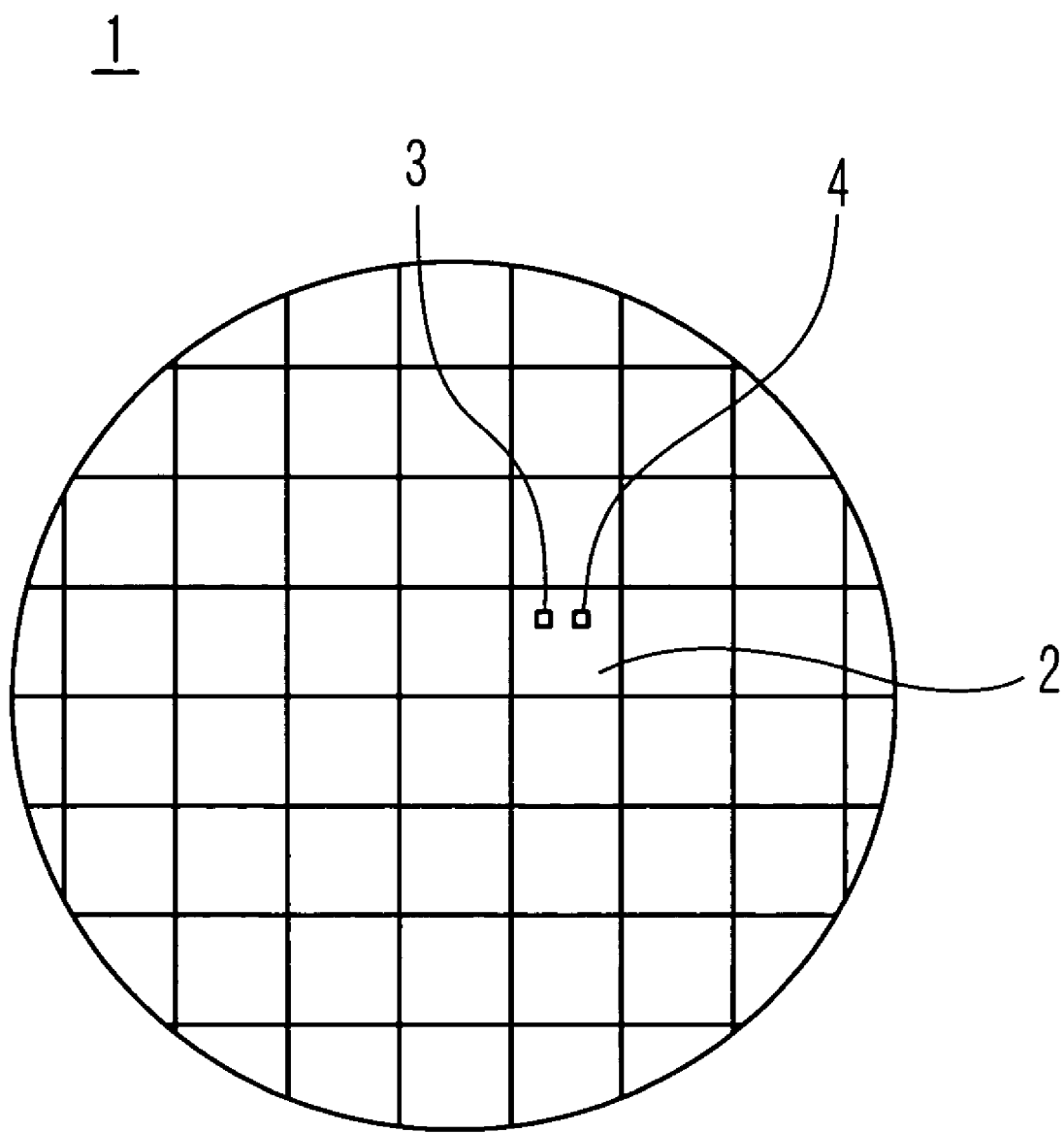
FIG. 1 is a plan view of a semiconductor wafer according to an embodiment of the present invention.

FIG. 1 is a plan view of a semiconductor wafer 1 according to an embodiment of the present invention. The semiconductor wafer 1 includes a plurality of pellet corresponding areas 2. Each of the pellet corresponding areas 2 includes a memory cell region 4 in which memory cells are formed and an outside of the memory cell region, 3 as a region other than the memory cell region 4. Each of the pellet corresponding areas 2 corresponds to one pellet. Each pellet is packaged to provide a semiconductor device. SRAM (Static Random Access Memory) is an example of the semiconductor device.

Figure 2:
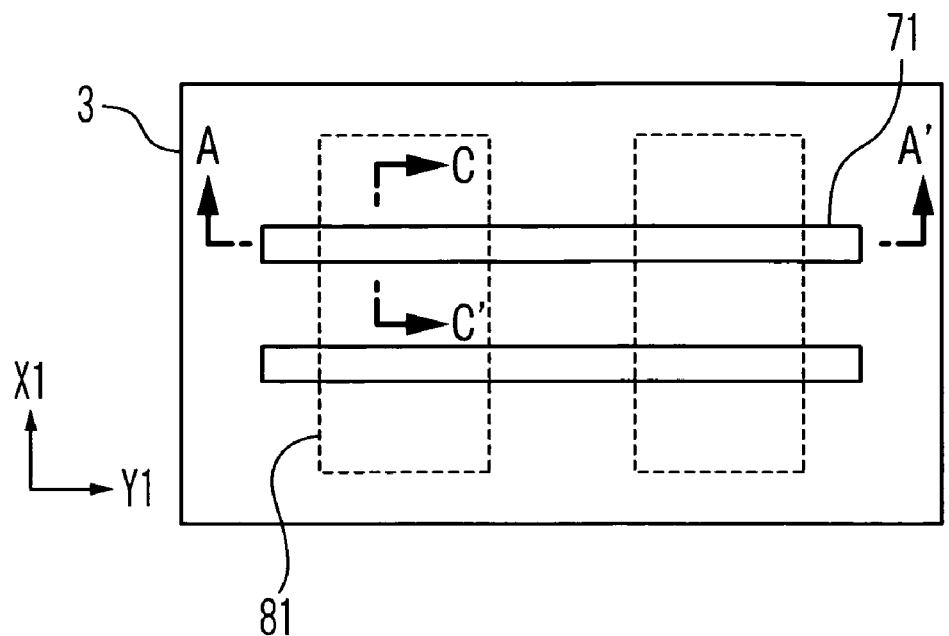
FIG. 2 is a plan view of a transistor formed in an outside of a memory cell region of the semiconductor wafer.

FIG. 2 shows a plan view of a transistor formed in the outside 3. FIG. 2 shows an X1 axis and an Y1 axis which are orthogonal to each other. The direction of channel length of the transistor is parallel to the X1 axis. The direction of channel width of the transistor is parallel to the Y1 axis. In the outside 3, a gate electrode 71 of the transistor is provided above a diffusion layer 81. The gate electrode 71 extends along a straight line parallel to the Y1 axis.

Figure 3:
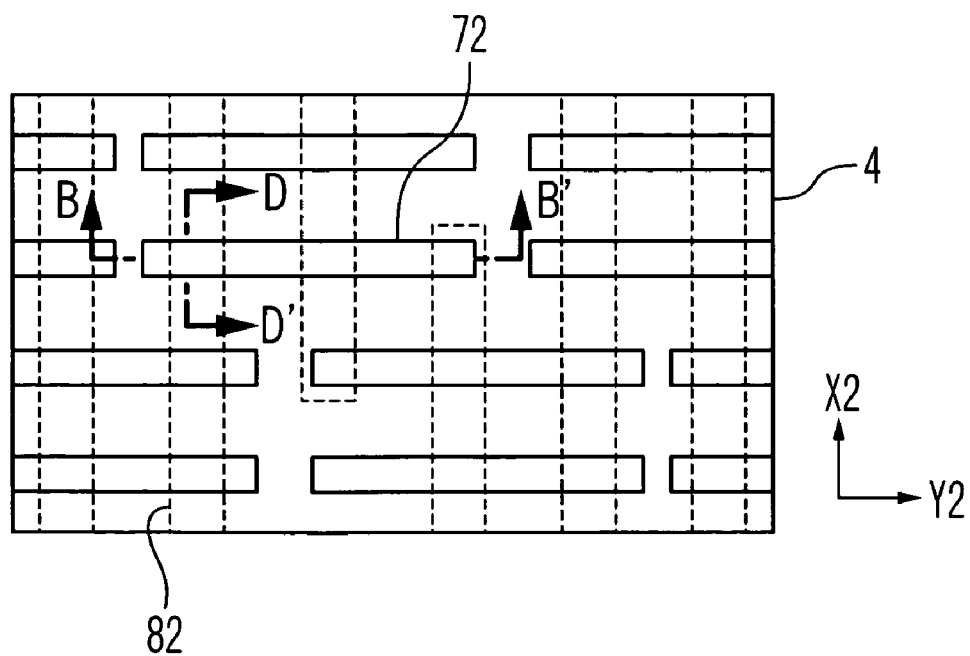
FIG. 3 is a plan view of a transistor formed in the memory cell region of the semiconductor wafer.

FIG. 3 shows a plan view of a transistor formed in the memory cell region 4. FIG. 3 shows an X2 axis and an Y2 axis which are orthogonal to each other. The direction of channel length of the transistor is parallel to the X2 axis. The direction of channel width of the transistor is parallel to the Y2 axis. In the memory cell region 4, a gate electrode 72 of the transistor is provided above a diffusion layer 82. The gate electrode 72 extends along a straight line parallel to the Y2 axis. The diffusion layer 82 extends along a straight line parallel to the X2 axis.

Hereinafter, referring to FIGS. 4A to 4E and FIGS. 5A to 5E, a process for manufacturing the semiconductor wafer 1 shown in FIGS. 1 to 3 will be described. FIGS. 4A to 4E show sectional views of the semiconductor wafer 1 in the outside 3 in order of the process. FIGS. 5A to 5E show sectional views of the semiconductor wafer 1 in the memory cell region 4 in order of the process.

Here, FIGS. 4A to 4D are sectional views along a cut line A-A' shown in FIG. 2. The cut line A-A' is parallel to the Y1 axis. FIG. 4E is a sectional view along a cut line C-C' shown in FIG. 2. The cut line C-C' is parallel to the X1 axis. FIGS. 5A to 5D are sectional views along a cut line B-B' shown in FIG. 3. The cut line B-B' is parallel to the Y2 axis. FIG. 5E is the sectional view along a cut line D-D' shown in FIG. 3. The cut line D-D' is parallel to the X2 axis.

Figure 4A:
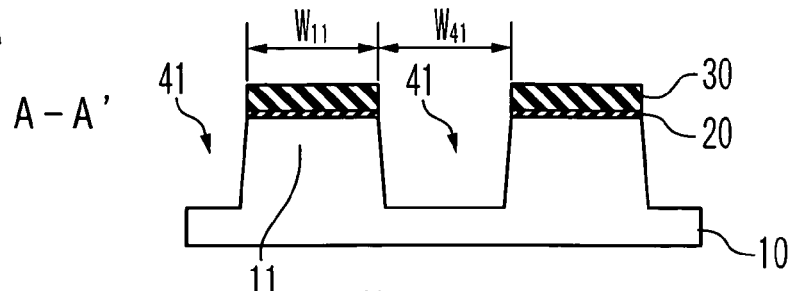
FIGS. 4A to 4E are sectional views of the semiconductor wafer in the outside of the memory cell region in order of process of a manufacturing method of semiconductor device according to the present embodiment.
Figure 5A:
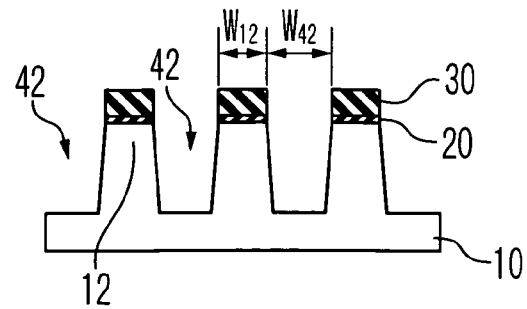
FIGS. 5A to 5E are sectional views of the semiconductor wafer in the memory cell region in order of process of the manufacturing method of semiconductor device according to the present embodiment.

As shown in FIGS. 4A and 5A, a silicon oxide film 20 is formed on a silicon substrate 10, and a silicon nitride film 30 is formed on the silicon oxide film 20. The silicon oxide film 20 is formed by thermally oxidizing the silicon substrate 10 for example. The silicon substrate 10 includes a first region corresponding to the outside 3 and a second region corresponding to the memory cell region 4. The first region is a region to be a portion of the outside 3. The second region is a region to be a portion of the memory cell region 4. Then, trenches 41 and 42 are formed which reach from the silicon nitride film 30 to the silicon substrate 10.

As shown in FIG. 4A, the trenches 41 are formed in the first region of the silicon substrate 10. Two of the trenches 41 are provided to be adjacent to each other in the direction of the Y1 axis. The first region of the silicon substrate 10 includes a first portion 11 as a portion between the two trenches 41 adjacent to each other. A width W11 along the Y1 axis of a portion of the silicon nitride film 30 above the first portion 11 is substantially equal to a width along the Y1 axis of the first portion 11. The width along the Y1 axis of the first portion 11 is substantially equal to the channel width of the transistor to be formed in the outside 3.

As shown in FIG. 5A, the trenches 42 are formed in the second region of the silicon substrate 10. Two of the trenches 42 are provided to be adjacent to each other in the direction of the Y2 axis. The second region of the silicon substrate 10 includes a second portion 12 as a portion between the two trenches 42 adjacent to each other. A width W12 along the Y2 axis of a portion of the silicon nitride film 30 above the second portion 12 is substantially equal to a width along the Y2 axis of the second portion 12. The width along the Y2 axis of the second portion 12 is substantially equal to the channel width of the transistor to be formed in the memory cell region 4.

The channel width of the transistor to be formed in the outside 3 is wider than the channel width of the transistor to be formed in the memory cell region 4.

Figure 4B:
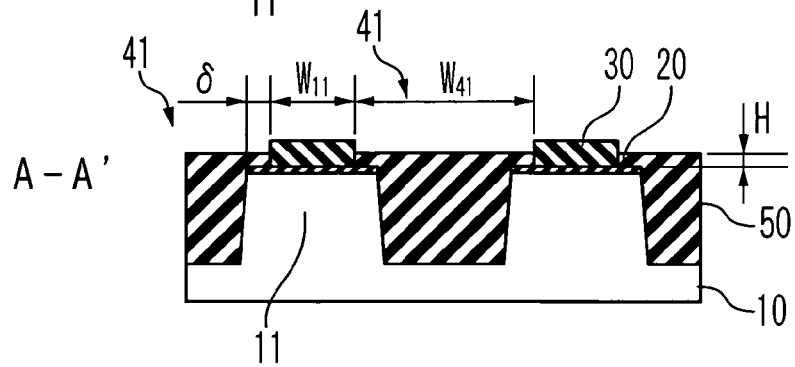
Figure 5B:
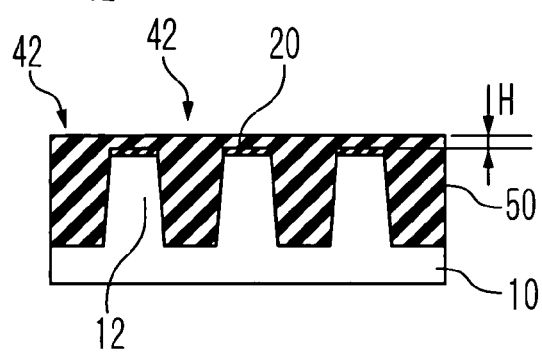

After that, as shown in FIGS. 4B and 5B, the silicon nitride film 30 is retreated, an buried oxide film 50 is formed to be buried in the trenches 41 and 42, the buried oxide film 50 is polished by CMP with the silicon nitride film 30 being used as a stopper, and then wet etching is applied to the buried oxide film 50. The buried oxide film 50 is a dielectric film such as a silicon oxide film. Portions of the buried oxide film 50 buried in the trenches 41 and portions of the buried oxide film 50 buried in the trenches 42 function for element isolation.

The retreat of the silicon nitride film 30 is performed such that width W41 in the Y1 direction of the trench 41 at the silicon nitride film 30 is widened and width W42 in the Y2 direction of the trench 42 at the silicon nitride film 30 is widened. For example, the silicon nitride film 30 is retreated by isotropic dry etching. At this time, the portion of the silicon nitride film 30 above the first portion 11 is left and the portion of the silicon nitride film 30 above the second portion 12 is removed. That is, the silicon nitride film 30 is retreated such that double of retreat length δ along the Y1 axis of the portion of the silicon nitride film 30 above the first portion 11 is larger than the width W12 (FIG. 5A) along the Y2 axis of the portion of the silicon nitride film 30 above the second portion 12 before the retreat. Here, the width W11 along the Y1 axis of the portion of the silicon nitride film 30 above the first portion 11 after the retreat shown in FIG. 4B is smaller than the width W11 before the retreat shown in FIG. 4B by 2δ.

Since the channel width of the transistor to be formed in the outside 3 is larger than the channel width of the transistor to be formed in the memory cell region 4, it is easy to leave the portion of the silicon nitride film 30 above the first portion 11 and remove the portion of the silicon nitride film 30 above the second portion 12.

By wet-etching the buried oxide film 50, a thickness H of a portion of the buried oxide film 50 on the silicon oxide film 20 is adjusted to be a desired value.

As shown in FIG. 4B, the silicon oxide film 20 on the first portion includes an adjacent portion adjacent to the trench 41 and a central portion far from the trench 41. The adjacent portion is covered by the buried oxide film 50. The central portion is covered by the retreated silicon nitride film 30. Meanwhile, as shown in FIG. 5B, whole of the silicon oxide film 20 on the second portion 12, which includes an adjacent portion adjacent to the trench 42 and a central portion far from the trench 42, is covered by the buried oxide film 50.

Figure 4C:
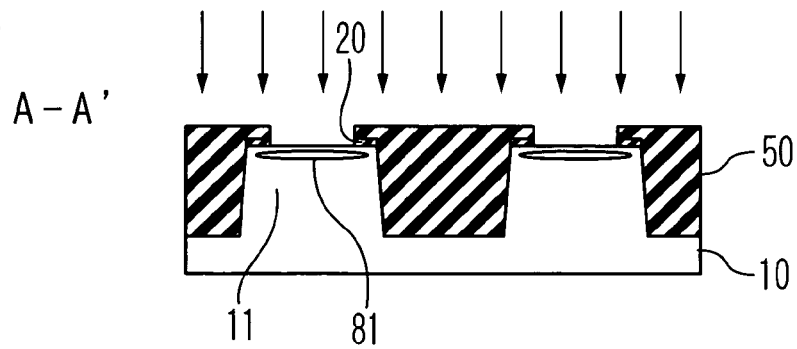
Figure 5C:
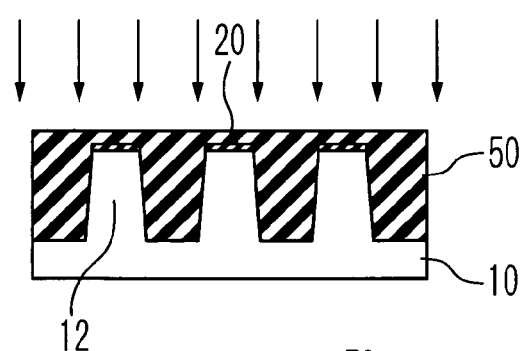

After that, as shown in FIGS. 4C and 5C, the portion of the silicon nitride film 30 above the first portion 11 and the portion of the silicon oxide film 20 under that portion are removed, and impurity for adjusting a threshold voltage of the transistor to be formed in the outside 3 is implanted into the first portion 11 to form the diffusion layer 81 in the first portion 11.

The portion of the silicon nitride film 30 above the first portion 11 and the portion of the silicon oxide film 20 under that portion are removed by wet etching, for example. At this time, the portion of the buried oxide film 50 above the first portion 11 and the portion of the silicon oxide film 20 under that portion are not removed; and the portion of the buried oxide film 50 above the second portion 12 and the portion of the silicon oxide film 20 under that portion are not removed. As a result, an opening is formed on the first portion 11 by removing the portion of the silicon nitride film 30 and the portion of the silicon oxide film 20 under that portion. Meanwhile, no opening is formed on the second portion 12.

The impurity is implanted from the opening into the first portion 11. At this time, the implantation of impurity into the second portion 12 is prevented by the portion of the buried oxide film 50 above the second portion 12.

Figure 4D:
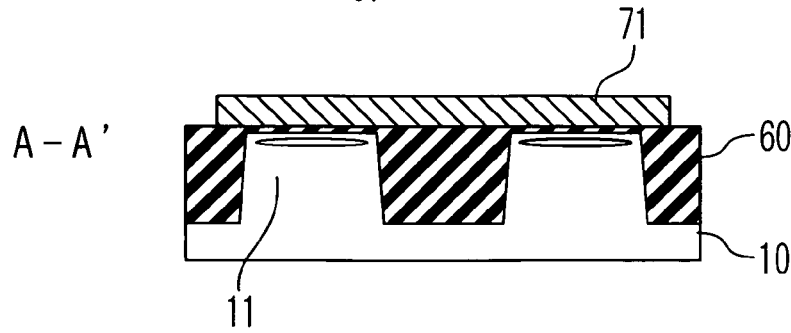
Figure 4E:
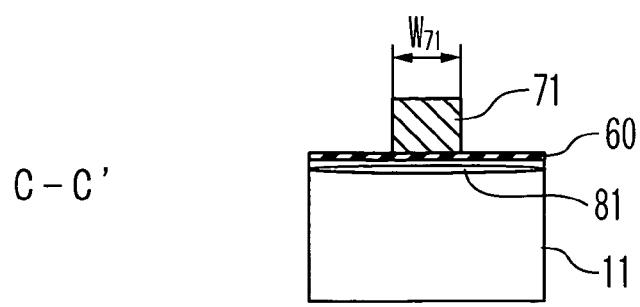
Figure 5D:
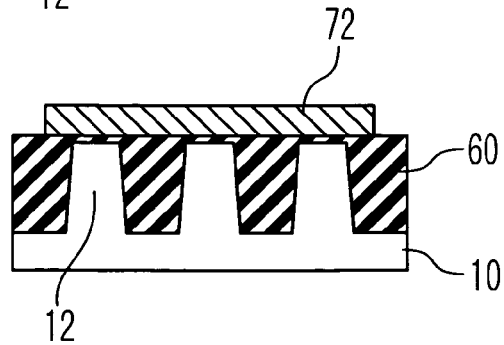
Figure 5E:
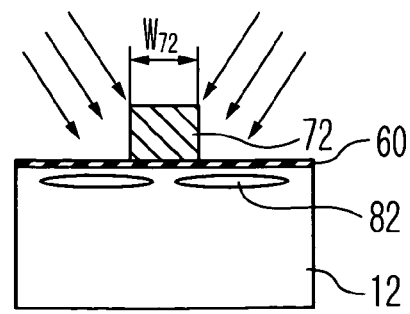

After that, as shown in FIGS. 4D and 5D, after forming a new oxide film and wet-etching, the gate electrode 71 is formed above the first portion 11 and the gate electrode 72 is formed above the second portion 12. The new oxide film, the silicon oxide film 20 and the buried oxide film 50 are shown as a silicon oxide film 60. A portion of the silicon oxide film 60 between the first portion 11 and the gate electrode 71 and a portion of the silicon oxide film 60 between the second portion 12 and the gate electrode 72 function as gate dielectric films.

After that, as shown in FIG. 5E, impurity for adjusting a threshold voltage of the transistor to be formed in the memory cell region 4 is implanted into the second portion 12 to form the diffusion layer 82 in the second portion 12. The impurity is implanted into the second portion 12 by (rotation) oblique ion implantation. In the oblique ion implantation, the impurity is implanted in the oblique direction with the gate electrode 72 being used as a mask. As a result, concentration distribution of the impurity in the diffusion layer 82 has peaks at deep locations beneath a source end and a drain end of the channel. Therefore, a short channel effect is suppressed.

A Width W71 in the direction of the X1 axis of the gate electrode 71 is substantially equal to the channel length of the transistor to be formed in the outside 3. A width W72 in the direction of the X2 axis of the gate electrode 72 is substantially equal to the channel length of the transistor to be formed in the memory cell region 4.

When the channel length of the transistor to be formed in the memory cell region 4 is shorter than the channel length of the transistor to be formed in the outside 3, it is relatively easy to implant the impurity into the second portion 12 by the oblique ion implantation.

When the impurity is implanted into the second portion 12 as shown in FIG. 5E, no impurity is implanted into the first portion 11 as shown in FIG. 4E.

In the embodiment of the present invention, since the silicon nitride film 30 is retreated, generation of a divot in the oxide film buried in the trenches 41 and 42 is prevented.

Further, since the implantation of the impurity into the first portion 11 is performed separately from the implantation of the impurity into the second portion 12, it is easy to adjust both the threshold voltage of the transistor to be formed in the outside 3 and the threshold voltage of the transistor to be formed in the memory cell region 4 to be desired values.

It is apparent that the present invention is not limited to the above embodiments, but may be modified and changed without departing from the scope and spirit of the invention.

What is claimed is:

1. A manufacturing method of semiconductor device, comprising:
    forming a nitride film above a silicon substrate including a first region and a second region which respectively correspond to an outside of a memory cell region and said memory cell region;
    forming trenches reaching from said nitride film to said silicon substrate;
    laterally retreating said nitride film such that widths of said trenches at said nitride film become wider;
    forming a buried oxide film to be buried in said trenches after said retreating;
    polishing said buried oxide film with said nitride film being used as a stopper;
    removing said nitride film after said polishing;
    implanting impurity after said removing;
    forming gate electrodes after said implanting; and
    implanting impurity after said forming said gate electrodes, and
    wherein said trenches include two of first trenches and two of second trenches,
    said two of first trenches are adjacent to each other and formed in said first region,
    said two of second trenches are adjacent to each other and formed in said second region,
    a portion of said nitride film above a first portion of said silicon substrate between said two of first trenches in said first region is left in said retreating,
    all of said nitride film above a second portion of said silicon substrate between said two of second trenches in said second region is removed in said retreating,
    impurity for adjusting a threshold voltage of a first transistor to be formed in said outside of said memory cell region is implanted into said first portion in said implanting impurity after said removing, and
    a first gate electrode is formed above said first portion and a second gate electrode is formed above said second portion in said forming said gate electrodes.

2. The manufacturing method of semiconductor device according to claim 1, wherein impurity for adjusting a threshold voltage of a second transistor to be formed in said memory cell region is implanted into said second portion by oblique ion implantation in said implanting impurity after said forming said gate electrodes.

3. The manufacturing method of semiconductor device according to claim 1, wherein channel width and channel length of said second transistor are smaller than channel width and channel length of said first transistor, respectively.

4. The manufacturing method of semiconductor device according to claim 1, wherein a portion of said buried oxide film above said second portion prevents impurity from being implanted into said second portion in said implanting impurity after said removing, and
    no impurity is implanted into said first portion in said implanting impurity after said forming said gate electrodes.

* * * * *